United States Patent
Burroughes et al.

(10) Patent No.: US 9,111,885 B2
(45) Date of Patent: Aug. 18, 2015

(54) ELECTRONIC DEVICES AND METHODS OF MAKING THE SAME USING SOLUTION PROCESSING TECHNIQUES

(75) Inventors: Jeremy Burroughes, Cambridge (GB); Mark Dowling, Elsworth (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 1008 days.

(21) Appl. No.: 12/808,630

(22) PCT Filed: Dec. 17, 2008

(86) PCT No.: PCT/GB2008/004135
§ 371 (c)(1),
(2), (4) Date: Nov. 10, 2010

(87) PCT Pub. No.: WO2009/077738
PCT Pub. Date: Jun. 25, 2009

(65) Prior Publication Data
US 2011/0042656 A1 Feb. 24, 2011

(30) Foreign Application Priority Data
Dec. 19, 2007 (GB) .................................. 0724773.7

(51) Int. Cl.
*H01L 27/12* (2006.01)
*H01L 27/32* (2006.01)
(Continued)

(52) U.S. Cl.
CPC ........ *H01L 27/3246* (2013.01); *H01L 27/3274* (2013.01); *H01L 27/1292* (2013.01); *H01L 27/283* (2013.01); *H01L 51/0003* (2013.01);
(Continued)

(58) Field of Classification Search
CPC ............ H01L 27/1214; H01L 51/0005; H01L 51/0541; H01L 51/0545; H01L 27/1292; H05K 2203/1173; H05K 3/1258
USPC .................................... 438/781; 257/E21.174
See application file for complete search history.

(56) References Cited

U.S. PATENT DOCUMENTS

| 4,539,507 A | 9/1985 | VanSlyke et al. |
| 5,150,006 A | 9/1992 | Van Slyke et al. |

(Continued)

FOREIGN PATENT DOCUMENTS

| EP | 0880303 A1 | 11/1998 |
| EP | 0901176 A2 | 3/1999 |

(Continued)

OTHER PUBLICATIONS

Mikes et al., "Synthesis and Characterization of an Amorphous Perfluoropolymer," Macromolecules, vol. 38, 2005, pp. 4237-4245.*

(Continued)

*Primary Examiner* — Steven J Fulk
(74) *Attorney, Agent, or Firm* — Marshall, Gerstein & Borun LLP

(57) ABSTRACT

An electronic device comprising: an electronic substrate comprising circuit elements; a double bank well-defining structure disposed over the electronic substrate, the double bank well-defining structure comprising a first layer of insulating material and a second layer of insulating material thereover, the second layer of insulating material having a lower wettability than the first layer of insulating material; and organic semiconductive material disposed in wells defined by the double bank well-defining structure.

28 Claims, 7 Drawing Sheets

(51) Int. Cl.
| | |
|---|---|
| H05K 3/12 | (2006.01) |
| H01L 27/28 | (2006.01) |
| H01L 51/00 | (2006.01) |
| H01L 51/05 | (2006.01) |
| H01L 51/56 | (2006.01) |

(52) U.S. Cl.
CPC ......... *H01L 51/0005* (2013.01); *H01L 51/0541* (2013.01); *H01L 51/0545* (2013.01); *H01L 51/56* (2013.01); *H05K 3/1258* (2013.01); *H05K 2203/1173* (2013.01)

(56) References Cited

U.S. PATENT DOCUMENTS

| | | | |
|---|---|---|---|
| 5,432,014 | A | 7/1995 | Sano et al. |
| 5,723,873 | A | 3/1998 | Yang |
| 5,798,170 | A | 8/1998 | Zhang et al. |
| 6,083,634 | A | 7/2000 | Shi |
| 6,268,695 | B1 | 7/2001 | Affinito |
| 6,953,628 | B2 | 10/2005 | Kamatani et al. |
| 7,030,138 | B2 | 4/2006 | Fujimoto et al. |
| 7,125,998 | B2 | 10/2006 | Stossel et al. |
| 7,238,435 | B2 | 7/2007 | Kamatani et al. |
| 7,544,426 | B2 | 6/2009 | Kamatani et al. |
| 2002/0117662 | A1 | 8/2002 | Nii |
| 2002/0182441 | A1 | 12/2002 | Lamansky et al. |
| 2004/0201048 | A1* | 10/2004 | Seki et al. ................ 257/294 |
| 2005/0003166 | A1* | 1/2005 | Hirai ........................ 428/195.1 |
| 2006/0110545 | A1 | 5/2006 | Toyoda |
| 2007/0020834 | A1 | 1/2007 | Hirai et al. |
| 2007/0020899 | A1* | 1/2007 | Hirai et al. .............. 438/584 |
| 2007/0023837 | A1* | 2/2007 | Lee et al. ................ 257/347 |

FOREIGN PATENT DOCUMENTS

| | | | |
|---|---|---|---|
| EP | 0947123 | A1 | 10/1999 |
| EP | 0949850 | A1 | 10/1999 |
| EP | 0 989 778 | A1 | 3/2000 |
| EP | 1245659 | A1 | 10/2002 |
| EP | 1 424 350 | A1 | 6/2004 |
| GB | 2348316 | A | 9/2000 |
| JP | 2002324679 | A | 11/2002 |
| WO | WO-90/13148 | A1 | 11/1990 |
| WO | WO-95/06400 | A1 | 3/1995 |
| WO | WO-9810621 | A1 | 3/1998 |
| WO | WO-9857381 | A1 | 12/1998 |
| WO | WO-99/21935 | A1 | 5/1999 |
| WO | WO-99/48160 | A1 | 9/1999 |
| WO | WO-0048258 | A1 | 8/2000 |
| WO | WO-0055927 | A1 | 9/2000 |
| WO | WO-0119142 | A1 | 3/2001 |
| WO | WO-0181649 | A1 | 11/2001 |
| WO | WO-0231896 | A2 | 4/2002 |
| WO | WO-02/44189 | A1 | 6/2002 |
| WO | WO-02/45466 | A1 | 6/2002 |
| WO | WO-02/066552 | A1 | 8/2002 |
| WO | WO-02/067343 | A1 | 8/2002 |
| WO | WO-02/068435 | A1 | 9/2002 |
| WO | WO-02/081448 | A1 | 10/2002 |
| WO | WO-02084759 | A1 | 10/2002 |
| WO | WO-03/018653 | A1 | 3/2003 |
| WO | WO-03/022908 | A1 | 3/2003 |
| WO | WO-03/083960 | A1 | 10/2003 |
| WO | WO-2007023272 | A1 | 3/2007 |

OTHER PUBLICATIONS

Bernius et al., "Progress with Light-Emitting Polymers," *Adv. Matter*, 12:1737-1750 (2000).
Bharathan et al., "Polymer electroluminescent devices processed by inkjet printing: I. Polymer light-emitting logo," *Applied Physics Letters*, 72:2660-2662 (1998).
Chang et al., "Dual-color polymer light-emitting pixels processed by hybrid inkjet printing," *Applied Physics Letters*, 73:2561-2563 (1998).
Chen et al., "Recent Developments in Molecular Organic Electroluminescent Materials," *Macromol. Symp.*, 125:1-48 (1997).
Chen et al., "Triplet exciton confinement in phosphorescent polymer light-emitting diodes," *Applied Physics letters*, 82:1006-1008 (2003).
Cleave et al., "Harvesting Singlet and Triplet Energy in Polymer Led's," *Advanced Materials*, 11:285-288 (1999).
Grice et al., "High brightness and efficiency blue light-emitting polymer diodes," *Applied Physics Letters*, 73:629-631 (1998).
Ikai et al., "Highly efficient phosphorescence from organic light-emitting devices with an exciton-block layer," *Appl. Phys. Lett.*, 79:156-158 (2001).
Kim et al., "Improved operational stability of polyfluorene-based organic light-emitting diodes with plasma-treated indium-tin-oxide anodes," 74:3084-3086 (1999).
Lane et al., "Origin of electrophosphorescence from a doped polymer light emitting diode," *Physical Review B*, 63:235206-1/235206-8 (2001).
Lee et al., "Polymer phosphorescent light-emitting devices doped with tris(2-phenylpyridine) iridium as a triplet emitter," *Appl. Phys. Lett.*, 77:2280-2282 (2000).
Michaelson, "The work function of the elements and its periodicity," *J. Appl. Phys.*, 48:4729-4733 (1977).
Niu et al., "Thermal annealing below the glass transition temperature: A general way to increase performance of light-emitting diodes based on copolyfluorenes," *Applied Physics letters*, 81:634-636 (2002).
O'Brien et al., "Electrophosphoresence from a doped polymer light emitting diode," *Synthetic Metals*, 116:379-383 (2001).
Service, "Self-Assembled LEDs Shine Brightly," *Materials Science*, 279:1135 (1998).
Tokito et al., "Metal oxides as a hole-injecting layer for an organic electroluminescent device," *J. Phys. D: Appl. Phys*, 29:2750-2753 (1996).
Yamaguchi et al., "Effects of B and C on the ordering of $L1_0$-CoPt thin films," *Applied Physics Letters*, 79:2001-2003 (2001).
Zhu et al., "Synthesis of new iridium complexes and their electrophosphorescent properties in polymer light-emitting diodes," *J. Mater. Chem.*, 13:50-55 (2003).
International Search Report and Written Opinion for PCT/GB2008/004135 dated Apr. 14, 2009.

* cited by examiner

ELECTRONIC DEVICES AND METHODS OF MAKING THE SAME USING SOLUTION PROCESSING TECHNIQUES

FIELD OF INVENTION

The present invention relates to electronic devices and methods of making the same using solution processing techniques. Particular embodiments of the present invention relate to organic thin film transistors, organic optoelectronic devices, organic light emissive display devices and methods of making the same using solution processing techniques.

BACKGROUND OF THE INVENTION

Methods of manufacturing electronic devices involving depositing active components from solution are known in the art. Such methods involve the preparation of a substrate onto which one or more active components can be deposited. If active components are deposited from solution, one problem is how to contain the active components in desired areas of the substrate. One solution to this problem is to provide a substrate comprising a patterned bank layer defining wells in which the active components can be deposited in solution. The wells contain the solution while it is drying such that the active components remain in the areas of the substrate defined by the wells.

The aforementioned solution processing methods have been found to be particularly useful for deposition of organic materials in solution. The organic materials may be conductive, semi-conductive, and/or opto-electrically active such that they can emit light when an electric current is passed through them or detect light by generating a current when light impinges on them. Devices which utilize these materials are known as organic electronic devices. An example is an organic transistor device. If the organic material is a light-emissive material the device is known as an organic light-emissive device. Transistors and light emissive devices are discussed in more detail below.

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrons.

For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance. Ambipolar devices that can function as n-type or p-type devices are also known.

Transistors can be formed by depositing the components in thin films to form a thin film transistor (TFT). When an organic material is used as the semi-conductive material in such a device, it is known as an organic thin film transistor (OTFT).

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

An example of such an organic thin film transistor is shown in FIG. 1. The illustrated structure may be deposited on a substrate 1 and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to more clearly show the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

One problem with the aforementioned arrangements is how to contain the OSC within the channel region when it is deposited. A solution to this problem is to provide a patterned layer of insulating bank material 14 defining a well in which the OSC 8 can be deposited from solution by, for example, inkjet printing. Such an arrangement is shown in FIGS. 3 and 4 for bottom and top gate organic thin film transistors respectively. Again, in order to more clearly show the relationship between the structures illustrated in FIGS. 1 and 2, with those illustrated in FIGS. 3 and 4, like reference numerals have been used for corresponding parts.

The periphery of the well defined by the patterned layer of insulating material 14 surrounds some or all of the channel 6 defined between the source and drain electrodes 2, 4 in order to facilitate deposition of the OSC 8 by, for example, inkjet printing. Furthermore, as the insulating layer 14 is deposited prior to deposition of the OSC 8, it may be deposited and patterned without damaging the OSC. The structure of the insulating layer 14 can be formed in a reproducible manner using known deposition and patterning techniques such as photolithography of positive or negative resists, wet etching, dry etching, etc.

Even if a patterned layer of well-defining bank material is provided, problems still exist in containing the OSC within the channel region and providing good film formation of the OSC in the channel region using solution processing techniques for deposition of the OSC. Uncontrollable wetting of the well-defining bank layer may occur since the contact angle of the OSC solution on the well-defining bank layer is typically low. In the worst case the OSC may overspill the wells.

One solution is to treat the surface of the well-defining bank using, for example, a fluorine based plasma such as $CF_4$ in order to reduce its wettability prior to depositing the OSC from solution. A de-wetting surface on the top of the well-defining bank layer aids in containing the OSC within the wells when it is deposited.

Another solution is to use an inherently low-wetting material for the well-defining bank layer. US 2007/0023837 describes an arrangement in which a low-wetting fluorine containing polymer such as "Cytop" made by Asahi Glass in Japan is used to form a patterned well-defining bank layer when manufacturing a TFT substrate. The low-wetting fluorine containing polymer material is good at preventing the OSC from over-spilling the wells when deposited from solution. However, as the sides of the well are also low-wetting, the solution tends to be contained on the base of the well leading to poor film formation. That is, because the solution of OSC doesn't wet the sides of the well it forms a curved drop on the base of the well and dries to form a film of uneven thickness. Films of uneven thickness can adversely effect the performance of a resultant device as is known in the art.

US 2007/0020899 discloses treating the surface of a bank layer defining a wiring pattern for an electronic substrate using a fluorine based plasma in order to reduce its wettability as discussed previously. This document also describes an alternative method in which a two-layer bank structure is provided which defines a wiring pattern for an electronic substrate. The two-layer bank structure comprising a first layer which has good wettability and a second layer thereover comprising a low-wetting fluorine containing polymer.

With the aforementioned two-layer bank structure, a liquid deposited in the wells can wet the sides of the wells made of the first layer to provide good film formation in the wells on drying whereas the second layer prevents the liquid from over-spilling the wells. The document suggests that the materials for both the first and second bank layers should be polymers including siloxane bonds in a main chain and the polymer of the second bank layer should include fluorine bonds in a side chain. Materials for the second bank layer are described as having contact angles of 50° and above. A manufacturing process is also disclosed in which the two layer bank structure is formed, active component is deposited in wells defined by the bank structure, and then the active component and the bank structure are baked at the same time.

The aforementioned prior art document describes that conductive particles can be dispersed in a dispersion medium and deposited into areas defined by the two-layer bank structure by inkjet printing in order to form conductive circuitry. It is described that the conductive particles can be a metal, an oxide, an alloy, an organometallic compound or a conductive polymer. Various dispersion mediums are listed including water, alcohols, hydrocarbon compounds and ether compounds.

The document describes that the aforementioned method can be used to manufacture back plane circuitry for a display. According to the document, a TFT substrate is provided on which the two-layer bank structure is then deposited and used to define areas in which pixel electrodes are deposited by inkjet printing conductive particles of, for example, ITO in a dispersion medium. It is described that the substrate can be used as a back plane for a liquid crystal display or an organic electroluminescent device. For the organic electroluminescent device two separate bank structures appear to be disclosed: a first bank structure defining pixel electrodes which is formed using the previously described two-layer bank structure; and a second bank structure defining wells in which hole transporting material and light emissive material are inkjet printed, this second bank structure consisting of a single layer which is not treated in any way.

The aforementioned prior art relates to the provision of low-wettability banks for the manufacture of TFT substrates although the use of single bank layer structures for light emissive materials is also mentioned. Organic light emissive devices are discussed in more detail below.

Displays fabricated using OLEDs (organic light emitting devices) provide a number of advantages over other flat panel technologies. They are bright, colourful, fast-switching, provide a wide viewing angle, and are easy and cheap to fabricate on a variety of substrates. Organic (which here includes organometallic) light emitting diodes (LEDs) may be fabricated using materials including polymers, small molecules and dendrimers, in a range of colours which depend upon the materials employed. Examples of polymer-based organic LEDs are described in WO 90/13148, WO 95/06400 and WO 99/48160. Examples of dendrimer-based materials are described in WO 99/21935 and WO 02/067343. Examples of so called small molecule based devices are described in U.S. Pat. No. 4,539,507.

A typical OLED device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

OLEDs may be deposited on a substrate in a matrix of pixels to form a single or multi-color pixelated display. A multicolored display may be constructed using groups of red, green, and blue emitting pixels. So-called active matrix displays have a memory element, typically a storage capacitor and a thin film transistor (TFT), associated with each pixel whilst passive matrix displays have no such memory element and instead are repetitively scanned to give the impression of a steady image. Other passive displays include segmented displays in which a plurality of segments share a common electrode and a segment may be lit up by applying a voltage to its other electrode. A simple segmented display need not be scanned but in a display comprising a plurality of segmented regions the electrodes may be multiplexed (to reduce their number) and then scanned.

FIG. 5a shows a vertical cross section through an example of an OLED device 100. In an active matrix display, part of the area of a pixel is occupied by associated drive circuitry (not shown in FIG. 5a). The structure of the device is somewhat simplified for the purposes of illustration.

The OLED 100 comprises a substrate 102, typically 0.7 mm or 1.1 mm glass but optionally clear plastic or some other substantially transparent material. An anode layer 104 is deposited on the substrate, typically comprising around 40 to 150 nm thickness of ITO (indium tin oxide), over part of which is provided a metal contact layer. Typically the contact layer comprises around 500 nm of aluminum, or a layer of aluminum sandwiched between layers of chrome, and this is sometimes referred to as anode metal. Glass substrates coated with ITO and contact metal are widely available. The contact metal over the ITO helps provide reduced resistance pathways where the anode connections do not need to be transparent, in particular for external contacts to the device. The contact metal is removed from the ITO where it is not wanted, in particular where it would otherwise obscure the display, by a standard process of photolithography followed by etching.

A substantially transparent hole injection layer 106 is deposited over the anode layer, followed by an electroluminescent layer 108, and a cathode 110. The electroluminescent layer 108 may comprise, for example, a PPV (poly(p-phenylenevinylene)) and the hole injection layer 106, which helps match the hole energy levels of the anode layer 104 and electroluminescent layer 108, may comprise a conductive transparent polymer, for example PEDOT:PSS (polystyrene-sulphonate doped polyethylene-dioxythiophene) from H. C. Starck of Germany. In a typical polymer-based device the hole transport layer 106 may comprise around 200 nm of PEDOT. The light emitting polymer layer 108 is typically around 70 nm in thickness. These organic layers may be deposited by spin coating (afterwards removing material from unwanted areas by plasma etching or laser ablation) or by inkjet printing. In this latter case, banks 112 may be formed on the substrate, for example using photoresist, to define wells into which the organic layers may be deposited. Such wells define light emitting areas or pixels of the display.

Cathode layer 110 typically comprises a low work function metal such as calcium or barium (for example deposited by physical vapor deposition) covered with a thicker, capping layer of aluminum. Optionally an additional layer may be provided immediately adjacent the electroluminescent layer, such as a layer of lithium fluoride, for improved electron energy level matching. Mutual electrical isolation of cathode lines may be achieved or enhanced through the use of cathode separators (not shown in FIG. 5a).

The same basic structure may also be employed for small molecule devices.

Typically a number of displays are fabricated on a single substrate and at the end of the fabrication process the substrate is scribed, and the displays separated before an encapsulating can is attached to each to inhibit oxidation and moisture ingress. Alternatively, the displays can be encapsulated prior to scribing and separating.

To illuminate the OLED, power is applied between the anode and cathode by, for example, battery 118 illustrated in FIG. 5a. In the example shown in FIG. 5a light is emitted through transparent anode 104 and substrate 102 and the cathode is generally reflective. Such devices are referred to as "bottom emitters". Devices which emit through the cathode ("top emitters") may also be constructed, for example, by keeping the thickness of cathode layer 110 less than around 50-100 nm so that the cathode is substantially transparent and/or using a transparent cathode material such as ITO.

Referring now to FIG. 5b, this shows a simplified cross-section through a passive matrix OLED display device 150, in which like elements to those of FIG. 5a are indicated by like reference numerals. As shown, the hole transport layer 106 and the electroluminescent layer 108 are subdivided into a plurality of pixels 152 at the intersection of mutually perpendicular anode and cathode lines defined in the anode metal 104 and cathode layer 110 respectively. In the figure conductive lines 154 defined in the cathode layer 110 run into the page and a cross-section through one of a plurality of anode lines 158 running at right angles to the cathode lines is shown. An electroluminescent pixel 152 at the intersection of a cathode and anode line may be addressed by applying a voltage between the relevant lines. The anode metal layer 104 provides external contacts to the display 150 and may be used for both anode and cathode connections to the OLEDs (by running the cathode layer pattern over anode metal lead-outs).

The above mentioned OLED materials, and in particular the light emitting polymer material and the cathode, are susceptible to oxidation and to moisture. The device is therefore encapsulated in a metal or glass can 111, attached by UV-curable epoxy glue 113 onto anode metal layer 104. Preferably the anode metal contacts are thinned where they pass under the lip of the metal can 111 to facilitate exposure of glue 113 to UV light for curing.

Considerable effort has been dedicated to the realization of a full-color, all plastic screen. The major challenges to achieving this goal have been: (1) access to conjugated polymers emitting light of the three basic colors red, green and blue; and (2) the conjugated polymers must be easy to process and fabricate into full-color display structures. Polymer light emitting devices (PLEDs) show great promise in meeting the first requirement, since manipulation of the emission color can be achieved by changing the chemical structure of the conjugated polymers. However, while modulation of the chemical nature of conjugated polymers is often easy and inexpensive on the lab scale it can be an expensive and complicated process on the industrial scale. The second requirement of easy processability and build-up of full-color matrix devices raises the question of how to micro-pattern fine multicolor pixels and how to achieve full-color emission. Inkjet printing and hybrid inkjet printing technology have attracted much interest for the patterning of PLED devices (see, for example, Science 1998, 279, 1135; Wudl et al, Appl Phys. Lett. 1998, 73, 2561; and J. Bharathan, Y. Yang, Appl. Phys. Lett. 1998, 72, 2660).

In order to contribute to the development of a full-color display, conjugated polymers exhibiting direct color-tuning, good processability and the potential for inexpensive large-scale fabrication have been sought. Poly-2,7-fluorenes have been the subject of much research into blue-light emitting polymers (see, for example, A. W. Grice, D. D. C. Bradley, M. T. Bernius, M. Inbasekaran, W. W. Wu, and E. P. Woo, Appl. Phys. Lett. 1998, 73, 629; J. S. Kim, R. H. Friend, and F. Cacialli, Appl. Phys. Lett. 1999, 74, 3084; WO-A-00/55927 and M. Bernius et al. 1, Adv. Mater., 2000, 12, No. 23, 1737).

Active matrix organic light-emitting devices (AMOLEDs) are known in the art wherein electroluminescent pixels and a cathode are deposited onto a glass substrate comprising active matrix circuitry for controlling individual pixels and a transparent anode. Light in these devices is emitted towards the viewer through the anode and the glass substrate (so-called bottom-emission). Devices with transparent cathodes (so-called "top-emitting" devices) have been developed as a solution to this problem. A transparent cathode must possess the following properties: transparency; conductivity; and low workfunction for efficient electron injection into the LUMO of the electroluminescent layer of the device or, if present, an electron transporting layer.

An Example of a top-emitting device is shown in FIG. 6. The top-emitting device comprises a substrate 202 on which an insulating planarization layer 204 is disposed. A via hole is provided in the planarization layer 204 so an anode can be connected to its associated TFT (not shown). An anode 206 is disposed on the planarization layer 204 over which well-defining banks 208 are provided. The anode 206 is preferably reflective. Electroluminescent material 210 is disposed in the wells defined by the banks and a transparent cathode 212 is deposited over the wells and the banks to form a continuous layer.

Inkjet printing of electroluminescent formulations is a cheap and effective method of forming patterned devices. As disclosed in EP-A-0880303, this entails use of photolithography to form wells that define pixels into which the electroluminescent material is deposited by inkjet printing. It is also known to treat the well-defining layer with a fluorine based plasma to decrease the wettability of an upper surface of the well-defining bank layer prior to deposition of the electroluminescent material in a similar manner to that described previous in relation to TFTs.

It is an aim of the present invention to improve on the devices and methods of manufacture described above.

SUMMARY OF THE PRESENT INVENTION

According to a first aspect of the present invention there is provided an electronic device comprising: an electronic substrate comprising circuit elements; a double bank well-defining structure disposed over the electronic substrate, the double bank well-defining structure comprising a first layer of insulating material and a second layer of insulating material thereover, the second layer of insulating material having a lower wettability than the first layer of insulating material; and organic semiconductive material disposed in wells defined by the double bank well-defining structure.

The second layer is formed of an inherently low-wettability (high contact angle) material forming a separate and distinct layer as opposed to a treated surface of the first layer in which the chemical nature of the surface of the first layer is modified.

As discussed in the background section, it is known to provide a single bank structure defining wells in which organic semiconductive material of a device is deposited. It is also known to treat the surface of this single bank structure to decrease its wettability using a fluorine based plasma treatment.

However, the present applicant has found that there are some problems associated with such treatments. Treatments to reduce the wettability of the insulating bank layer are generally unstable and the treated surface tends to revert to its original wettability over a period of time, particularly if subjected to further processing steps. Thus, if the insulating layer is treated in order to reduce its surface wettability prior to patterning to form wells, by the time the wells have been formed and the organic semiconductive material is ready to be deposited, the surface tends to have reverted towards its original wettability. Alternatively, if the wells are formed first and then a surface treatment is applied, such surface treatments have been found to damage circuitry of an electronic substrate exposed in the well.

Having identified these problems, the present applicant has realized that a double bank well-defining structure would solve these problems. While is it known from US 2007/0020899 to provided a double bank well-defining structure for inkjet printing of conductive particles in a dispersion medium in order to form circuitry of an electronic substrate, the present inventors have found that it is actually more useful to provided a double bank well-defining structure for active organic semiconductive material to be deposited over an electronic substrate as other methods of decreasing wettability such as plasma treatments have been found to damage the underlying electronic circuitry of the substrate exposed in the wells.

The organic semiconductive material may form the active layer of an OTFT or an active layer of an OLED.

In the case of an OTFT, the circuit elements of the electronic substrate comprise source and drain electrodes over which the double bank structure is disposed with a channel region defined between the source and drain electrodes. For a bottom-gate OTFT, the electronic substrate also comprises a gate electrode with a gate dielectric disposed thereover, the source and drain electrodes being disposed over the gate dielectric. The present invention has been found to be particularly useful for bottom gate OTFTs as the gate dielectric in the channel region exposed in the well defined by the bank structure has been found by the present applicant to be particularly sensitive to alternative treatment methods such as fluorine based plasma treatments.

In the case of an OLED, the circuit elements of the electronic substrate comprise a lower electrode of the OLED. In an active matrix OLED display device, the circuit elements of the electronic substrate also comprise an OTFT which itself may be formed using a double bank structure in accordance with the present invention.

According to second aspect of the present invention there is provided a method of manufacturing an electronic device, the method comprising: providing an electronic substrate comprising circuit elements; forming a double bank well-defining structure over the electronic substrate, the double bank well-defining structure comprising a first layer of insulating material and a second layer of insulating material thereover, the second layer of insulating material having a lower wettability than the first layer of insulating material; and depositing a solution of organic semiconductive material in wells defined by the double bank well-defining structure.

The method of the second aspect of the present invention is suitable for manufacturing electronic devices according to the first aspect of the present invention. The organic semiconductive material may be deposited in an aqueous solution or alternatively an organic solvent may be used. Inkjet printing is the preferred method for depositing the solution of organic semiconductive material in the wells defined by the double bank well-defining structure. However, using a double bank structure in which the top layer has a very low wettability (a very high contact angle), other solution processing techniques are possible. For example, the solution may be deposited in a less discriminate manner over the substrate, e.g. flood printing, and the very high contact angle top-layer of the bank structure ensures that the solution flows into the wells such that none of the solution remains over the bank structure.

Preferably the first and second layers of the double bank well-defining structure are formed of an organic material, most preferably polymer materials. The present applicant has found that certain fluorinated polymers such as Cytop have a much higher contact angle, and are thus a much lower wettability, than other fluorinated polymers, for example, greater than 80°. The present applicant has found that these very high contact angle polymers have certain disadvantages for use in single layer bank structures such as those described in US 2007/0023837, i.e. they result in films which are not uniform in thickness as described previously. However, the present applicant has found that they are ideal for use as a top layer in a double bank structure.

Thus, in accordance with another aspect of the present invention there is provided an electronic device comprising: a substrate; a double bank well-defining structure disposed over the substrate, the double bank well-defining structure comprising a first layer of insulating material and a second layer of insulating material thereover, the second layer of insulating material having a lower wettability than the first layer of insulating material; and organic material disposed in wells defined by the double bank well-defining structure, the second layer of insulating material having a contact angle of greater than 80°.

Furthermore, there is provided a method which is suitable for manufacturing such electronic devices, the method comprising: providing a substrate; forming a double bank well-defining structure over the substrate, the double bank well-defining structure comprising a first layer of insulating material and a second layer of insulating material thereover, the second layer of insulating material having a lower wettability than the first layer of insulating material; and depositing a solution of organic material in wells defined by the double bank well-defining structure, the second layer of insulating material having a contact angle of greater than 80°.

Preferably the contact angle of the second layer of insulating material is even higher, e.g. greater than 100°. Examples of very high contact angle materials include Cytop-type materials from Aldrich. An example of a Cytop-type material is Poly-1,1,2,4,4,5,5,6,7,7-decafluoro-3-oxa-1,6-heptadiene which has a contact angle of approximately 135°. This may be provided in amount of 8-10% by weight in a solvent of perfluorotrialkylamine constituting 90-92% by weight of the solution. Such materials have been found to be particularly useful for depositing organic material from aqueous solution, for example, aqueous solutions of conductive polymers, particularly hole injecting polymers such as PEDOT. Such materials are also useful for depositing organic material from organic solvents. As such, a double bank structure comprising a second layer of such a material can be used, for example, when depositing a hole injecting layer from aqueous solution and a light-emissive layer from an organic solvent.

The present applicant has identified that it is particularly advantageous to form the second layer of the double bank structure using a solution comprising a fluorinated polymer and a fluorinated solvent. Thus according to another aspect of the present invention there is provided a method of manufacturing an electronic devices, the method comprising: providing a substrate; forming a double bank well-defining structure over the substrate, the double bank well-defining structure comprising a first layer of insulating material and a second layer of insulating material thereover, the second layer of insulating material having a lower wettability than the first layer of insulating material; and depositing a solution of organic material in wells defined by the double bank well-defining structure, wherein the second layer of insulating material is a fluorinated polymer which is deposited from a fluorinated solvent.

Another problem which the present applicant has identified is that of poor adhesion between the two layers of material in the double bank structure. Accordingly, the present applicant has found it beneficial to provide an adhesive layer between the two layers, for example, an adhesive resin. This may be deposited on the first layer of the bank structure, by spin coating for example, prior to deposition of the second layer. Thus, in accordance with another aspect of the present invention there is provided an electronic device comprising: a substrate; a double bank well-defining structure disposed over the substrate, the double bank well-defining structure comprising a first layer of insulating material and a second layer of insulating material thereover, the second layer of insulating material having a lower wettability than the first layer of insulating material; and organic material disposed in wells defined by the double bank well-defining structure, wherein the double bank well-defining structure comprises a layer of adhesive material disposed between the first and second layers.

The present applicant has yet further found that baking can decrease the wettability of the second layer of bank material. As such, they have found it beneficial to provide a baking step prior to deposition of organic material from solution. As such, in accordance with another aspect of the present invention there is provided a method of manufacturing an electronic devices, the method comprising: providing a substrate; forming a double bank well-defining structure over the substrate, the double bank well-defining structure comprising a first layer of insulating material and a second layer of insulating material thereover, the second layer of insulating material having a lower wettability than the first layer of insulating material; and depositing a solution of organic material in wells defined by the double bank well-defining structure, wherein the double bank well-defining structure is subjected to a baking step prior to depositing the solution of organic material in wells defined by the double bank well-defining structure. The bake may be at a temperature in the range 150 to 250°, more preferably, 170 to 210°, most preferably 180 to 200°. The bake is preferably performed in an inert atmosphere such as $N_2$. For an organic light-emissive device, hole injecting material such as PEDOT may be deposited prior to the bake such that the hole injecting layer and the bank structure are baked at the same time prior to deposition of the organic light-emissive material in the wells.

Yet another problem that the present applicant has identified is that after forming the wells in a bank structure, it is desirable to provide a cleaning step such as an $O_2$ plasma treatment. Such a step cleans the surfaces in the wells and increases wettability of these surfaces prior to deposition or organic material therein. However, the present applicant has found that such a step greatly increases the wettability of surfaces of the bank which have been previously treated with, for example, a fluorine based plasma treatment in order to decrease their wettability. In fact, contact angles of such a treated surface can drop to under 10° after such a cleaning step. As such, when containment of organic material in the wells has been an issue, such a cleaning step had to be avoided. In contrast, the present applicant has found that when using a double bank structure with an inherently low wetting second layer, the cleaning step can be performed while retaining good de-wetting characteristics over the bank. For example, the contact angle for Cytop-type materials remains over 100° even after an $O_2$ plasma cleaning step. Thus, in accordance with another aspect of the present invention there is provided a method of manufacturing an electronic devices, the method comprising: providing a substrate; forming a double bank well-defining structure over the substrate, the double bank well-defining structure comprising a first layer of insulating material and a second layer of insulating material thereover, the second layer of insulating material having a lower wettability than the first layer of insulating material; and depositing a solution of organic material in wells defined by the double bank well-defining structure, wherein the method further comprises a cleaning step after forming the double bank well-defining step and prior to depositing the solution of organic material in wells defined by the double bank well-defining structure.

In one particularly preferred embodiment, the previously described baking step is performed after the cleaning step and prior to depositing the solution of organic material in wells defined by the double bank well-defining structure. The baking step has been found to regenerate a low-wettability surface on the bank after cleaning using, for example, an $O_2$ plasma.

The present applicant has also found that it is advantageous in certain circumstances to form the double bank structure such that the first and second layers define a step structure around the wells. Such a step structure can allow the wells to be overfilled with solution. Such a structure can also provide two different pinning points for different fluids deposited in the wells, one at an edge of the first layer around the well and one at an edge of the second layer stepped back from the well. This can ensure, for example, that on drying a second material deposited in the wells completely covers a first material deposited in the wells, particularly around the edges of the wells. The different fluids may be selected to have different wetting capabilities, for example, one of the fluids may be an aqueous solution and the other of the fluids may comprise and organic solvent.

Thus, according to another aspect of the present invention there is provided an electronic device comprising: a substrate; a double bank well-defining structure disposed over the substrate, the double bank well-defining structure comprising a first layer of insulating material and a second layer of insulating material thereover, the second layer of insulating material having a lower wettability than the first layer of insulating material; and organic material disposed in wells defined by the double bank well-defining structure, wherein the first and second layers of the double bank well-defining structure define a step structure around each of the wells According to another aspect of the present invention, the double bank well-defining structure may comprise discrete rings which define the perimeter of at least one well without extending to the perimeter of adjacent wells. This so-called "ring bank" arrangement comprises a plurality of discrete rings of bank material and is described in the present applicant's co-pending application PCT/GB2007/003595. This arrangement contrast with a conventional bank structure which is basically a continuous sheet with a plurality of holes (wells) formed therein.

According to preferred embodiments there is provided an organic thin film transistor or an organic light-emissive device manufactured according to the previously described structures and methods. According to certain embodiments there is provided an active matrix organic optical device and method of making the same in which an organic thin film transistor and an organic light-emissive device are provided according to the previously described structures and methods.

SUMMARY OF THE DRAWINGS

The present invention will now be described in further detail, by way of example only, with reference to the accompanying drawings in which.

DETAILED DESCRIPTION OF PREFERRED EMBODIMENTS

Embodiments of the present invention relate to printed electronic devices which comprise a patterned well-defining bank structure. Embodiments seek to provide a bank structure in which the side walls of the wells are wetting whereas the top of the bank structure is anti wetting. Embodiments also seek to provide a manufacturing process that involves no plasma processes using fluorine based gas systems which have been found to damage circuitry elements or device layers exposed in the wells. Embodiments have the potential for obtaining good device performance whilst retaining optimum printing performance during deposition of the active organic material of the device from solution.

Figure 1:
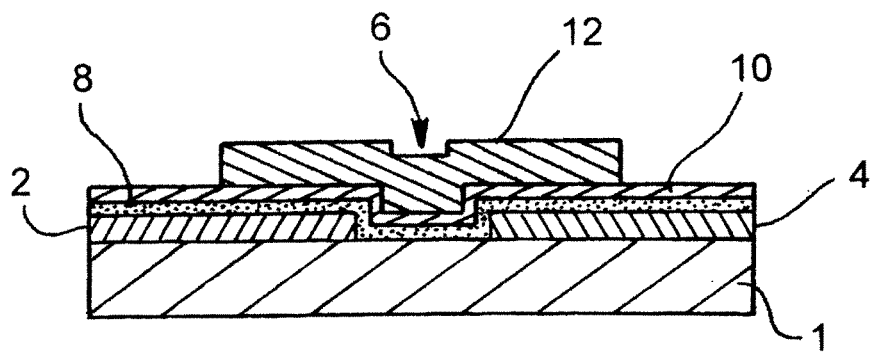
FIG. 1 shows a known top-gate organic thin film transistor arrangement.
Figure 2:
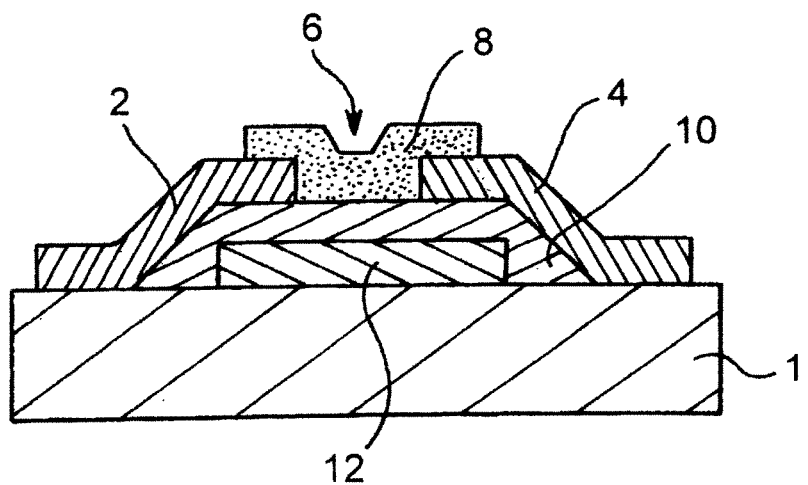
FIG. 2 shows a known bottom-gate organic thin film transistor arrangement.
Figure 3:
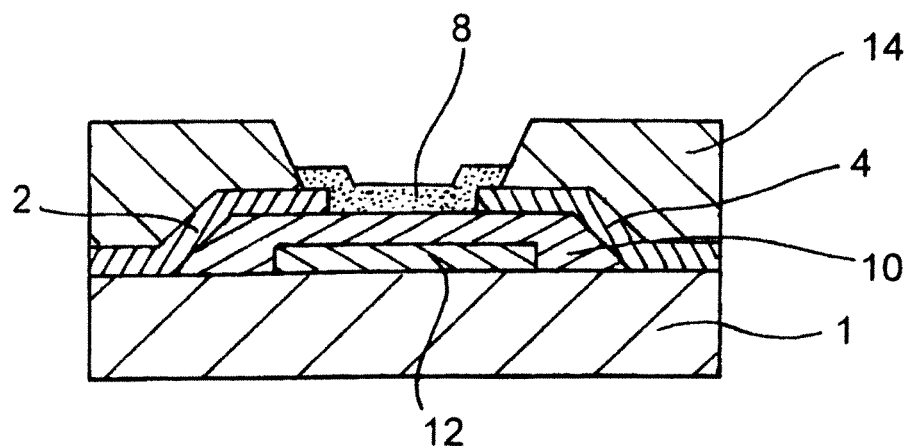
FIG. 3 shows a bottom-gate organic thin film transistor arrangement with a well for containing the organic semiconductor.
Figure 4:
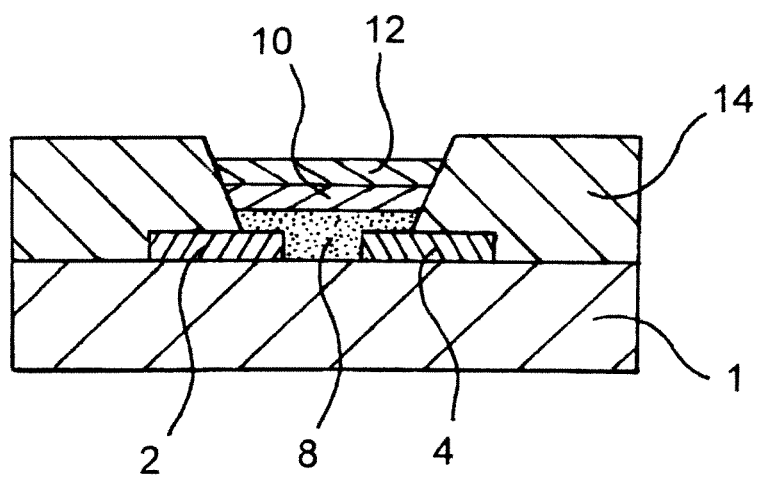
FIG. 4 shows a top-gate organic thin film transistor arrangement with a well for containing the organic semiconductor.
Figure 5A:
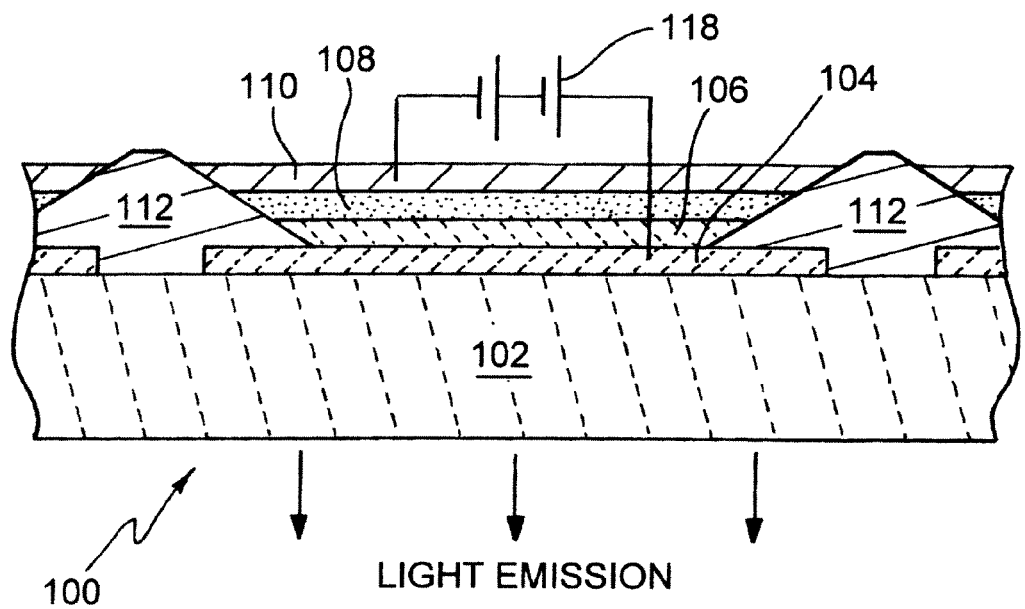
FIG. 5*a* shows a bottom-emitting organic light emitting device according to the prior art.
Figure 5B:
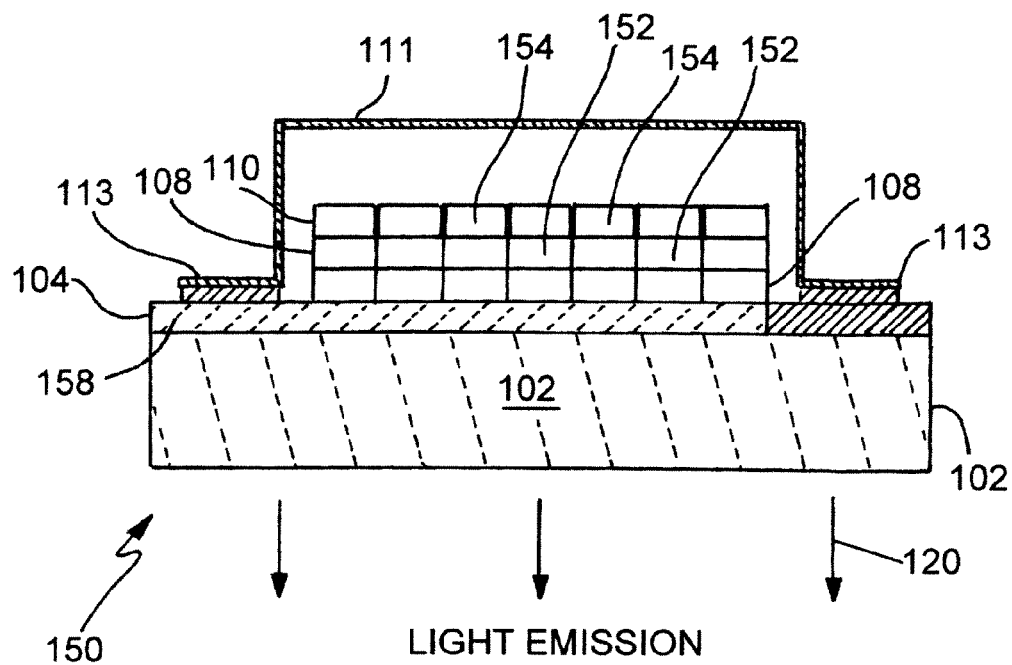
FIG. 5*b* shows a bottom-emitting organic light emitting display according to the prior art.
Figure 6:
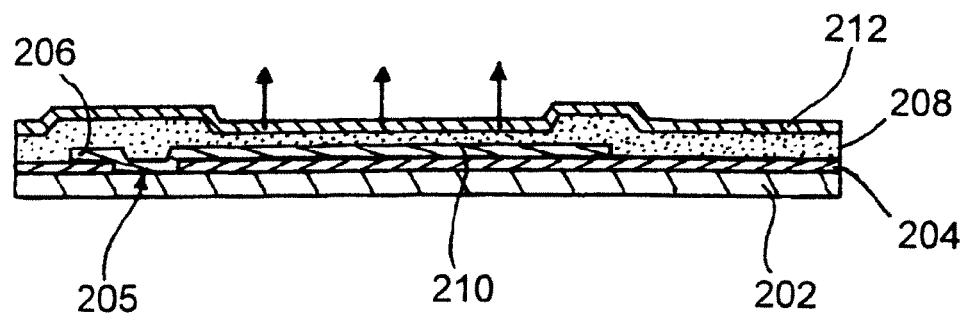
FIG. 6 shows a top-emitting organic light emitting device according to the prior art.
Figure 7:
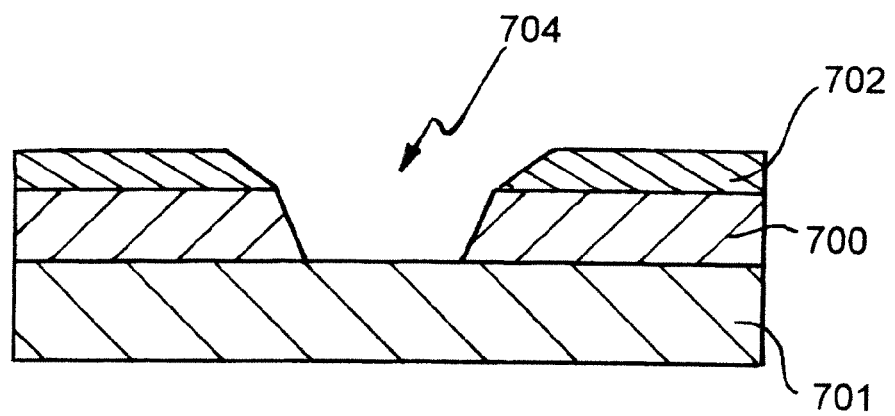
FIG. 7 shows a double bank structure according to an embodiment of the present invention.

FIG. 7 shows a double bank structure according to an embodiment of the present invention. The double bank structure is disposed on an electronic substrate 701 and comprises a lower layer 700 which may be a resist layer, another organic material such as polyimide, spin-on-glass or BOB, or an inorganic material such as $SiO_2$. An upper layer 702 of a material which has an inherently low wettability (high contact angle) is disposed over the lower layer. One embodiment uses for this upper layer 702 a material developed by Asahi Glass called Cytop, which is solution processable and hydrophobic even after oxygen plasma treatment. After depositing the Cytop over the lower layer, wells 704 can be formed in the double bank structure using a double lithography process or a self-aligned process.

Figure 8:
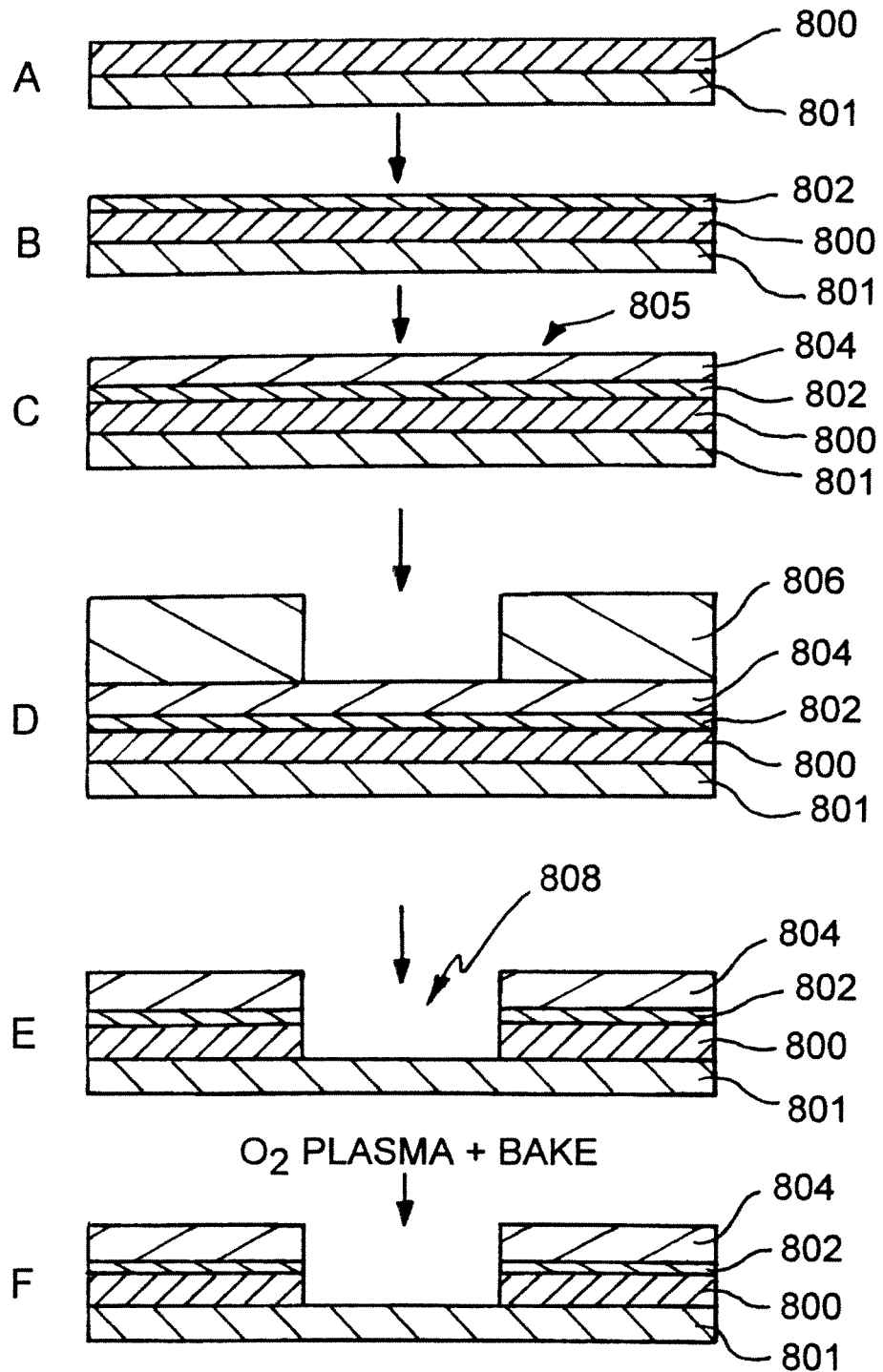
FIG. 8 shows the method steps involved in forming a double bank structure according to an embodiment of the present invention.

FIG. 8 shows the method steps involved in forming a double bank structure according to an embodiment of the present invention. First, an organic resist 800 is spin coated on an electronic substrate 801, baked and cross linked by, for example, UV flood exposure (FIG. 8A). Next a primer 802 is spin coated over the resist to enhance adhesion of the layer to be deposited thereover (FIG. 8B). Cytop 804 is then spin coated and soft baked (FIG. 8C). The structure is then exposed to an $O_2$ plasma treatment 805 to aid wetting. A thick layer of resist 806 is spin coated, UV exposed and developed to define a mask (FIG. 8D). An $O_2$ plasma etch through the Cytop 804 and the underlying resist layer 800 forms a well 808. Any excess material from the mask can also be removed (FIG. 8E). Just before active layers are deposited in the well 808, the structure is exposed to an $O_2$ plasma to clean the surfaces of the structure followed by a high temperature cure in $N_2$ at 180 C to regenerate hydrophobic surface (FIG. 8F).

Figure 9:
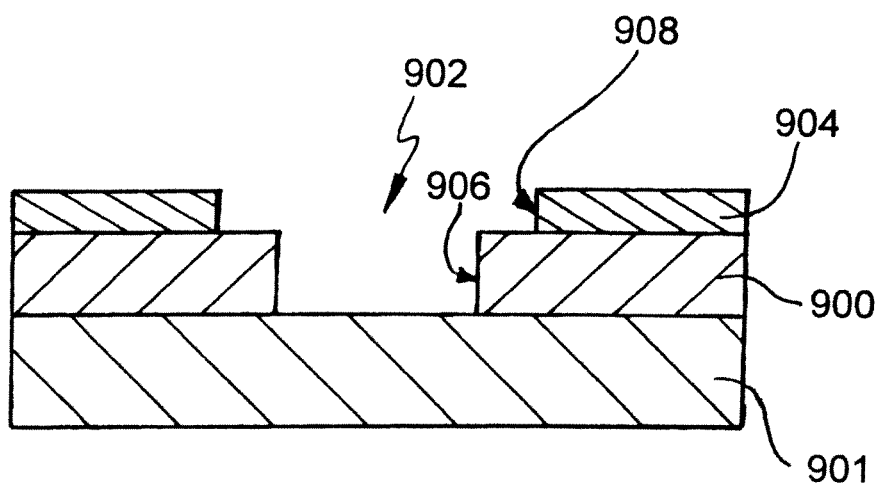
FIG. 9 shows a double bank structure according to another embodiment of the present invention.

FIG. 9 shows a double bank structure on a substrate 901 according to another embodiment of the present invention comprising a step structure around the wells. Such a structure provides two different pinning points for different fluids deposited in the wells, one at an edge 906 of the first layer 900 around the well 902 and one at an edge 908 of the second layer 904 stepped back from the well 902. This can ensure, for example, that on drying a second material deposited in the wells completely covers a first material deposited in the wells, particularly around the edges of the wells. The different fluids may be selected to have different wetting capabilities, for example, one of the fluids may be an aqueous solution and the other of the fluids may comprise and organic solvent. Although the step structure in FIG. 9 is illustrated which vertical walls, different shapes and angles may be provided. For example, the wall of the well defined by the first bank layer 900 may be undercut or have a positive profile. Similarly, the second bank layer 904 may have an undercut edge or have an edge with a positive profile.

Materials and processes suitable for forming an OTFT in accordance with embodiments of the present invention are discussed in further detail below.

Substrate

The substrate may be rigid or flexible. Rigid substrates may be selected from glass or silicon and flexible substrates may comprise thin glass or plastics such as poly(ethylene-terephthalate) (PET), poly(ethylene-naphthalate) PEN, polycarbonate and polyimide.

The organic semiconductive material may be made solution processable through the use of a suitable solvent. Exemplary solvents include: mono- or poly-alkylbenzenes such as toluene and xylene; tetralin; and chloroform. Preferred solution deposition techniques include spin coating and ink jet printing. Other solution deposition techniques include dip-coating, roll printing and screen printing.

Organic Semiconductor Materials

Preferred organic semiconductor materials include: small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal, having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimization of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Gate Dielectric

The gate dielectric comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include Si02, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, i.e. use of a solvent for deposition of the uppermost layer that does not dissolve the underlying layer; and crosslinking of the underlying layer.

The thickness of the gate dielectric layer is preferably less than 2 micrometers, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, e.g. octadecyltrichlorosilane. Similarly, the source and drain electrodes may be provided with a SAM to improve the contact between the organic semiconductor and the electrodes. For example, gold SD electrodes may be provided with a SAM comprising a thiol binding group and a group for improving the contact which may be a group having a high dipole moment; a dopant; or a conjugated moiety.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light emissive devices, in particular organic light emitting devices. OTFTs are particularly suited for use with active matrix organic light emitting devices, e.g. for use in display applications.

Figure 10:
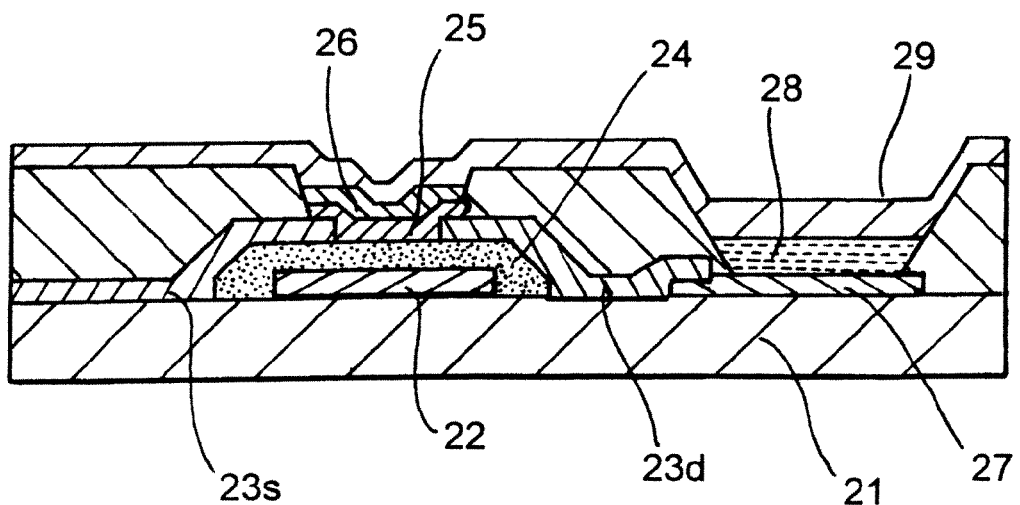
FIG. 10 illustrates a portion of an active matrix organic light emitting display comprising an organic thin film transistor and an organic light emitting device.

FIG. 10 shows a pixel comprising an organic thin film transistor and an adjacent organic light emitting device fabricated on a common substrate 21. The OTFT comprises gate electrode 22, dielectric layer 24, source and drain electrodes 23s and 23d respectively, and OSC layer 25. The OLED comprises anode 27, cathode 29 and an electroluminescent layer 28 provided between the anode and cathode. Further layers may be located between the anode and cathode, such as charge transporting, charge injecting or charge blocking layers. In the embodiment of FIG. 10, the layer of cathode material extends across both the OTFT and the OLED, and an insulating layer 26 is provided to electrically isolate the cathode layer 29 from the OSC layer 25. In this embodiment, the drain electrode 23d is directly connected to the anode of the organic light emitting device for switching the organic light emitting device between emitting and non-emitting states.

The active areas of the OTFT and the OLED are defined by a common bank material formed by depositing a layer of photoresist on substrate 21 and patterning it to define OTFT and OLED areas on the substrate. In accordance with an embodiment of the present invention the common bank has a two-layer structure as described previously.

Figure 11:
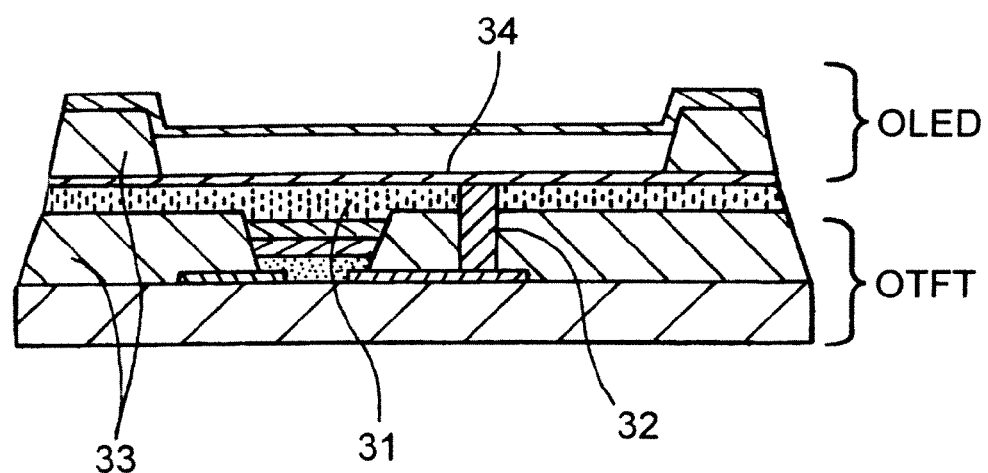
FIG. 11 illustrates a portion of another active matrix organic light emitting display arrangement comprising an organic thin film transistor and an organic light emitting device.

In an alternative arrangement illustrated in FIG. 11, an organic thin film transistor may be fabricated in a stacked relationship to an organic light emitting device. In such an embodiment, the organic thin film transistor is built up as described above in either a top or bottom gate configuration. As with the embodiment of FIG. 10, the active areas of the OTFT and OLED are defined by a patterned layer of photoresist 33, however in this stacked arrangement, there are two separate bank structures 33—one for the OLED and one for the OTFT. In accordance with an embodiment of the present invention these two separate bank structures each have a two-layer structure as described previously.

A planarization layer 31 (also known as a passivation layer) is deposited over the OTFT. Exemplary passivation layers include BCBs and parylenes. An organic light emitting device is fabricated over the passivation layer. The anode 34 of the organic light emitting device is electrically connected to the drain electrode of the organic thin film transistor by a conductive via 32 passing through passivation layer 31 and bank layer 33.

It will be appreciated that pixel circuits comprising an OTFT and an optically active area (e.g. light emitting or light sensing area) may comprise further elements. In particular, the OLED pixel circuits of FIGS. 10 and 11 will typically comprise least one further transistor in addition to the driving transistor shown, and at least one capacitor.

It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 11.

Materials and processes suitable for forming an OLED in accordance with embodiments of the present invention are discussed in further detail below.

General Device Architecture

The architecture of an electroluminescent device according to an embodiment of the invention comprises a transparent glass or plastic substrate, an anode and a cathode. An electroluminescent layer is provided between anode and cathode.

In a practical device, at least one of the electrodes is semi-transparent in order that light may be absorbed (in the case of a photoresponsive device) or emitted (in the case of an OLED). Where the anode is transparent, it typically comprises indium tin oxide.

Charge Transport Layers

Further layers may be located between anode and cathode, such as charge transporting, charge injecting or charge blocking layers.

In particular, it is desirable to provide a conductive hole injection layer, which may be formed from a conductive organic or inorganic material provided between the anode and the electroluminescent layer to assist hole injection from the anode into the layer or layers of semiconducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly (thienothiophene). Examples of conductive inorganic materials include transition metal oxides such as VOx MoOx and RuOx as disclosed in Journal of Physics D: Applied Physics (1996), 29(11), 2750-2753.

If present, a hole transporting layer located between anode and electroluminescent layer preferably has a HOMO level of less than or equal to 5.5 eV, more preferably around 4.8-5.5 eV. HOMO levels may be measured by cyclic voltammetry, for example.

If present, an electron transporting layer located between electroluminescent layer 3 and cathode 4 preferably has a LUMO level of around 3-3.5 eV.

Electroluminescent Layer

The electroluminescent layer may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semiconducting host matrix. Alternatively, the electroluminescent material may be covalently bound to a charge transporting material and/or host material.

The electroluminescent layer may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable materials for use in electroluminescent layer include small molecule, polymeric and dendrimeric materials, and compositions thereof. Suitable electroluminescent polymers include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. Suitable electroluminescent dendrimers include electroluminescent metal complexes bearing dendrimeric groups as disclosed in, for example, WO 02/066552.

Cathode

The cathode is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminum. Alternatively, it may comprise a plurality of metals, for example a bilayer of a low workfunction material and a high workfunction material such as calcium and aluminum as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum. Examples of transparent cathode devices are disclosed in, for example, GB 2348316.

Encapsulation

Optical devices tend to be sensitive to moisture and oxygen. Accordingly, the substrate preferably has good barrier properties for prevention of ingress of moisture and oxygen into the device. The substrate is commonly glass. However, alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Solution Processing

A single polymer or a plurality of polymers may be deposited from solution. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. Inkjet printing of OLEDs is described in, for example, EP 0880303.

Other solution deposition techniques include dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Emission Color

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

Hosts for Phosphorescent Emitters

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al., Appl. Phys. Lett., 79 no. 2, 2001, 156; and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

Metal Complexes (Mostly Phosphorescent but Includes Fluorescent at the End)

Preferred metal complexes comprise optionally substituted complexes of formula:

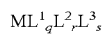

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula:

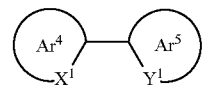

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

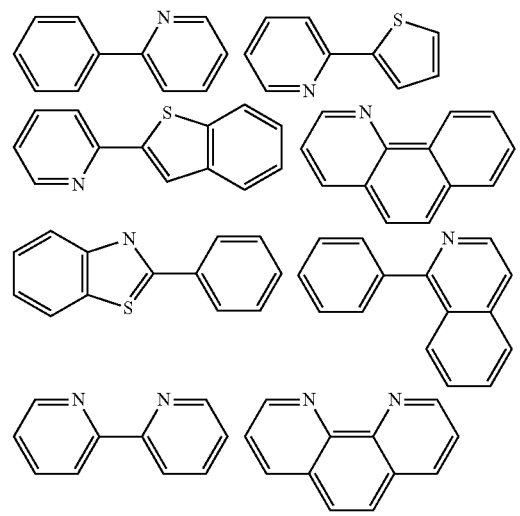

Each of $Ar^4$ and $Ar^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalize the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group. In one preferred embodiment, the branch group comprises Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. An organic thin film transistor comprising:
   an electronic substrate comprising circuit elements, the circuit elements of the electronic substrate comprising source and drain electrodes, a channel region being defined between the source and drain electrodes;
   a double bank well-defining structure disposed over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
   organic semiconductive material disposed in the wells defined by the double bank well-defining structure, wherein the first layer of insulating material comprises an organic polymer and the second layer of insulating material comprises a fluorinated organic polymer having inherently low wettability.

2. An organic thin film transistor according to claim 1, wherein the organic thin film transistor is a bottom-gate organic thin film transistor and the electronic substrate further comprises a gate electrode with a gate dielectric disposed thereover, the source and drain electrodes being disposed over the gate dielectric.

3. An organic thin film transistor according to claim 1, wherein the second layer of insulating material has a contact angle of greater than 80°.

4. An organic thin film transistor according to claim 3, wherein the second layer of insulating material has a contact angle of greater than 100°.

5. An organic thin film transistor according to claim 1, wherein the double bank well-defining structure comprises a layer of adhesive material disposed between the first and second layers.

6. An organic thin film transistor according to claim 1, wherein the first and second layers of the double bank well-defining structure define a step structure around each of the wells such that an edge of the first layer is around the well and an edge of the second layer is stepped back from the well.

7. An organic thin film transistor according to claim 1, wherein the fluorinated polymer is poly-1,1,2,4,4,5,5,6,7,7-decafluoro-3-oxa-1,6-heptadiene.

8. A method of manufacturing an organic thin film transistor, the method comprising:
   providing an electronic substrate comprising circuit elements, the circuit elements of the electronic substrate comprising source and drain electrodes, a channel region being defined between the source and drain electrodes;
   forming a double bank well-defining structure over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
   depositing a solution of organic semiconductive material in the wells defined by the double bank well-defining structure,
   wherein the first layer of insulating material comprises an organic polymer and the second layer of insulating material comprises a fluorinated organic polymer and is deposited from a fluorinated solvent,
   wherein the method further comprises cleaning after forming the double bank well-defining structure and prior to depositing the solution of organic material in the wells defined by the double bank well-defining structure.

9. A method according to claim 8, comprising depositing the organic semiconductive material in an organic solvent.

10. A method according to claim 8, comprising depositing a conductive organic material in the wells prior to depositing the organic semiconductive material thereon.

11. A method according to claim 10, comprising depositing the conductive organic material from an aqueous solution.

12. A method according to claim 8, wherein the second layer of insulating material has a contact angle of greater than 80°.

13. A method according to claim 12, wherein the second layer of insulating material has a contact angle of greater than 100°.

14. A method according to claim 8, comprising subjecting the double bank well-defining structure to baking prior to depositing the solution of organic material in wells defined by the double bank well-defining structure.

15. A method according to claim 14, comprising baking the double bank well-defining structure prior to depositing the solution of organic material in wells defined by the double bank well-defining structure at a temperature in the range 150 to 250° C.

16. A method according to claim 14, comprising baking in an inert atmosphere.

17. A method according to claim 14, comprising depositing a conductive organic material in the wells prior to depositing the organic semiconductive material thereon, and performing the baking step after depositing the organic conductive material and prior to depositing the organic semiconductive material.

18. A method according to claim 14, comprising baking the double bank well-defining structure prior to depositing the solution of organic material in wells defined by the double bank well-defining structure at a temperature in the range 170 to 210° C.

19. A method according to claim 14, comprising baking the double bank well-defining structure prior to depositing the solution of organic material in wells defined by the double bank well-defining structure at a temperature in the range 180 to 200° C.

20. A method according to claim 8, comprising subjecting the double bank well-defining structure to baking after cleaning and prior to depositing the solution of organic material in wells defined by the double bank well-defining structure.

21. A method according to claim 8, wherein the fluorinated polymer is poly-1,1,2,4,4,5,5,6,7,7-decafluoro-3-oxa-1,6-heptadiene.

22. An organic thin film transistor comprising:
a substrate comprising circuit elements, the circuit elements of the electronic substrate comprising source and drain electrodes, a channel region being defined between the source and drain electrodes;
a double bank well-defining structure disposed over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
organic material disposed in the wells defined by the double bank well-defining structure, the second layer of insulating material having a contact angle of greater than 80°, wherein the first layer of insulating material comprises an organic polymer and the second layer of insulating material comprises a fluorinated organic polymer having inherently low wettability.

23. An organic thin film transistor according to claim 22, wherein the fluorinated polymer is poly-1,1,2,4,4,5,5,6,7,7-decafluoro-3-oxa-1,6-heptadiene.

24. A method suitable for manufacturing an organic thin film transistor, the method comprising:
providing a substrate comprising circuit elements, the circuit elements of the electronic substrate comprising source and drain electrodes, a channel region being defined between the source and drain electrodes;
forming a double bank well-defining structure over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
depositing a solution of organic material in the wells defined by the double bank well-defining structure, the second layer of insulating material having a contact angle of greater than 80°,
wherein the first layer of insulating material comprises an organic polymer and the second layer of insulating material comprises a fluorinated organic polymer and is deposited from a fluorinated solvent,
wherein the method further comprises cleaning after forming the double bank well-defining step and prior to depositing the solution of organic material in the wells defined by the double bank well-defining structure.

25. A method of manufacturing organic thin film transistor, the method comprising:
providing a substrate comprising circuit elements, the circuit elements of the electronic substrate comprising source and drain electrodes, a channel region being defined between the source and drain electrodes;
forming a double bank well-defining structure over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
depositing a solution of organic material in the wells defined by the double bank well-defining structure, wherein the first layer of insulating material comprises an organic polymer and the second layer of insulating material comprises a fluorinated organic polymer that is deposited from a fluorinated solvent,
wherein the method further comprises cleaning after forming the double bank well-defining step and prior to depositing the solution of organic material in the wells defined by the double bank well-defining structure.

26. An organic thin film transistor comprising:
a substrate comprising circuit elements, the circuit elements of the electronic substrate comprising source and drain electrodes, a channel region being defined between the source and drain electrodes;
a double bank well-defining structure disposed over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
organic material disposed in the wells defined by the double bank well-defining structure, wherein the double bank well-defining structure comprises a layer of adhesive material disposed between the first and second layers, wherein the first layer of insulating material comprises an organic polymer and the second layer of insulating material comprises a fluorinated organic polymer having inherently low wettability.

27. A method of manufacturing an organic thin film transistor, the method comprising:
> providing a substrate comprising circuit elements, the circuit elements of the electronic substrate comprising source and drain electrodes, a channel region being defined between the source and drain electrodes;
> forming a double bank well-defining structure over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
> depositing a solution of organic material in the wells defined by the double bank well-defining structure, wherein the double bank well-defining structure is subjected to a baking step prior to depositing the solution of organic material in the wells defined by the double bank well-defining structure,
> wherein the first layer of insulating material comprises an organic polymer and the second layer of insulating material comprises a fluorinated organic polymer and is deposited from a fluorinated solvent,
> wherein the method further comprises cleaning after forming the double bank well-defining step and prior to depositing the solution of organic material in the wells defined by the double bank well-defining structure.

28. An organic thin film transistor comprising:
> a substrate comprising circuit elements, the circuit elements of the electronic substrate comprising source and drain electrodes, a channel region being defined between the source and drain electrodes;
> a double bank well-defining structure disposed over the source and drain electrodes, the double bank well-defining structure comprising a first layer of insulating material and a second layer of insulating material thereover, the second layer of insulating material having a lower wettability than the first layer of insulating material, both the first layer of insulating material and the second layer of insulating material being exposed in wells defined by the double bank well-defining structure, the first layer of insulating material defining bottom portions of the wells and the second layer of insulating material defining top portions of the wells; and
> organic material disposed in the wells defined by the double bank well-defining structure, wherein the first and second layers of the double bank well-defining structure define a step structure around each of the wells such that an edge of the first layer is around the well and an edge of the second layer is stepped back from the well, wherein the first layer of insulating material comprises an organic polymer and the second layer of insulating material comprises a fluorinated organic polymer having inherently low wettability.

* * * * *